United States Patent
Stopper et al.

(10) Patent No.: US 10,403,533 B2
(45) Date of Patent: Sep. 3, 2019

(54) SUBSTRATE ROTARY LOADER

(71) Applicant: Applied Materials, Inc., Santa Clara, CA (US)

(72) Inventors: Markus J. Stopper, Voerstetten (DE); Asaf Schlezinger, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 664 days.

(21) Appl. No.: 14/703,851

(22) Filed: May 4, 2015

(65) Prior Publication Data
US 2016/0325946 A1     Nov. 10, 2016

(51) Int. Cl.
*H01L 21/677*     (2006.01)

(52) U.S. Cl.
CPC .. *H01L 21/67766* (2013.01); *H01L 21/67736* (2013.01)

(58) Field of Classification Search
CPC ... B65G 47/91; B65G 47/04; H01L 21/67736; H01L 21/67766
USPC ........................................ 414/222.12, 226.03
See application file for complete search history.

(56) References Cited

U.S. PATENT DOCUMENTS

| | | | |
|---|---|---|---|
| 3,466,079 A | 9/1969 | Mammel | |
| 6,132,160 A * | 10/2000 | Iwai | H01L 21/67781 414/222.01 |
| 8,096,744 B2 * | 1/2012 | Okada | H01L 21/67201 414/217 |
| 2004/0247418 A1 | 12/2004 | Fujimura et al. | |
| 2006/0043750 A1 * | 3/2006 | Wirth | H01L 21/67742 294/103.1 |
| 2008/0085174 A1 * | 4/2008 | Rebstock | B25J 9/1674 414/222.12 |
| 2010/0290886 A1 * | 11/2010 | Hashimoto | B25J 9/042 414/800 |
| 2012/0321426 A1 * | 12/2012 | Tanaka | H01L 21/67766 414/728 |

FOREIGN PATENT DOCUMENTS

| | | | |
|---|---|---|---|
| KR | 20100033283 | * | 3/2010 |
| KR | 20100033283 A | | 3/2010 |

(Continued)

OTHER PUBLICATIONS

Extended Search Report from European Patent Application No. 16168394.1 dated Jul. 18, 2016.

*Primary Examiner* — Michael S Lowe
(74) *Attorney, Agent, or Firm* — Patterson + Sheridan LLP

(57) ABSTRACT

A method and apparatus for loading substrates in an inspection station is disclosed herein. In one embodiment a loading module for a substrate inspection station is disclosed herein. The loading module includes two arms, a plurality of substrate grippers, two rotatable support members, a conveyor, and at least one actuator. Each arm has a first end and a second end, wherein the second end is opposite the first end. Each substrate gripper is disposed at a respective end of each arm. Each rotatable support member is coupled to a respective one of the arms. The conveyor is disposed between the rotatable support members. The at least one actuator is configured to rotate the arms about the rotatable support members to selectively position the grippers over the conveyor in a location that allows a substrate held by the gripper to be released onto the conveyor.

20 Claims, 7 Drawing Sheets

(56) References Cited

FOREIGN PATENT DOCUMENTS

| WO | 2004093515 | * | 10/2004 |
| WO | 2004093515 A1 | | 10/2004 |
| WO | 2012039252 | * | 3/2012 |
| WO | 2012039252 A1 | | 3/2012 |

* cited by examiner

SUBSTRATE ROTARY LOADER

FIELD

Embodiments of the present disclosure generally relate to substrate loading equipment. More specifically, embodiments disclosed herein relate to a system and method for loading substrates into semiconductor inspection equipment.

BACKGROUND

Substrates, such as semiconductor substrates, are routinely inspected during processing at independent inspection stations to ensure compliance with predetermined quality control standards. Different inspection techniques provide comprehensive data regarding products and processes. However, comprehensive inspections can be time consuming, thus reducing throughput, due to the number of inspection stations required and the resulting transfer time of moving substrates therebetween. Thus, device manufacturers are often faced with the decision of choosing between thorough inspection stations with burdensome inspection/transfer times, or foregoing certain inspection processes.

However, as inspection processes have continued to decrease the amount of time required to complete required inspection steps, loading apparatuses also need to be improved to be able to keep up with the increased throughput.

Thus, there is a need for an proved substrate loading apparatus for use with inspection systems.

SUMMARY

In one embodiment, a loading module for a substrate inspection system is disclosed herein. The loading module includes two arms, a plurality of grippers, two rotatable support members, a conveyer, and at least one actuator. Each arm has a first end and a second end, wherein the second end is opposite the first end. Each substrate ripper is disposed at a respective end of each arm. Each rotatable support member is coupled to a respective one of the arms. The conveyor is disposed between the rotatable support members. The at least one actuator is configured to rotate the arms about the rotatable support members to selectively position the grippers over the conveyor in a location that allows a substrate held by the gripper to be released onto the conveyor.

In another embodiment, a loading module for a substrate inspection system is disclosed herein. The loading module includes a conveyor, two cassette holders disposed on opposite sides of the conveyor, two arms, two rotatable support members, and two actuators. Each arm includes a first end, a second end opposite the first end, a first gripper disposed on the first end of the first arm, and a second gripper disposed on the second end of the second arm. Each rotatable support member is coupled to one of the arms. Each actuator is coupled to a respective rotatable support member. The actuators are configured to rotate the arms about the rotatable support members such that the arms rotate in an indexing fashion between positions that allow the grippers to transfer substrates between the cassette holders and the conveyor.

In another embodiment, a method for loading substrates is disclosed herein. The method includes rotating a first arm a predetermined amount in a first direction to pick up a first substrate, rotating the first arm in the first direction and rotating a second arm a predetermined amount in a second direction, wherein the second direction is opposite the first direction, and continuing to rotate the first arm in the first direction and the second arm in the second direction in a stepping fashion to alternately pick up and load substrates.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
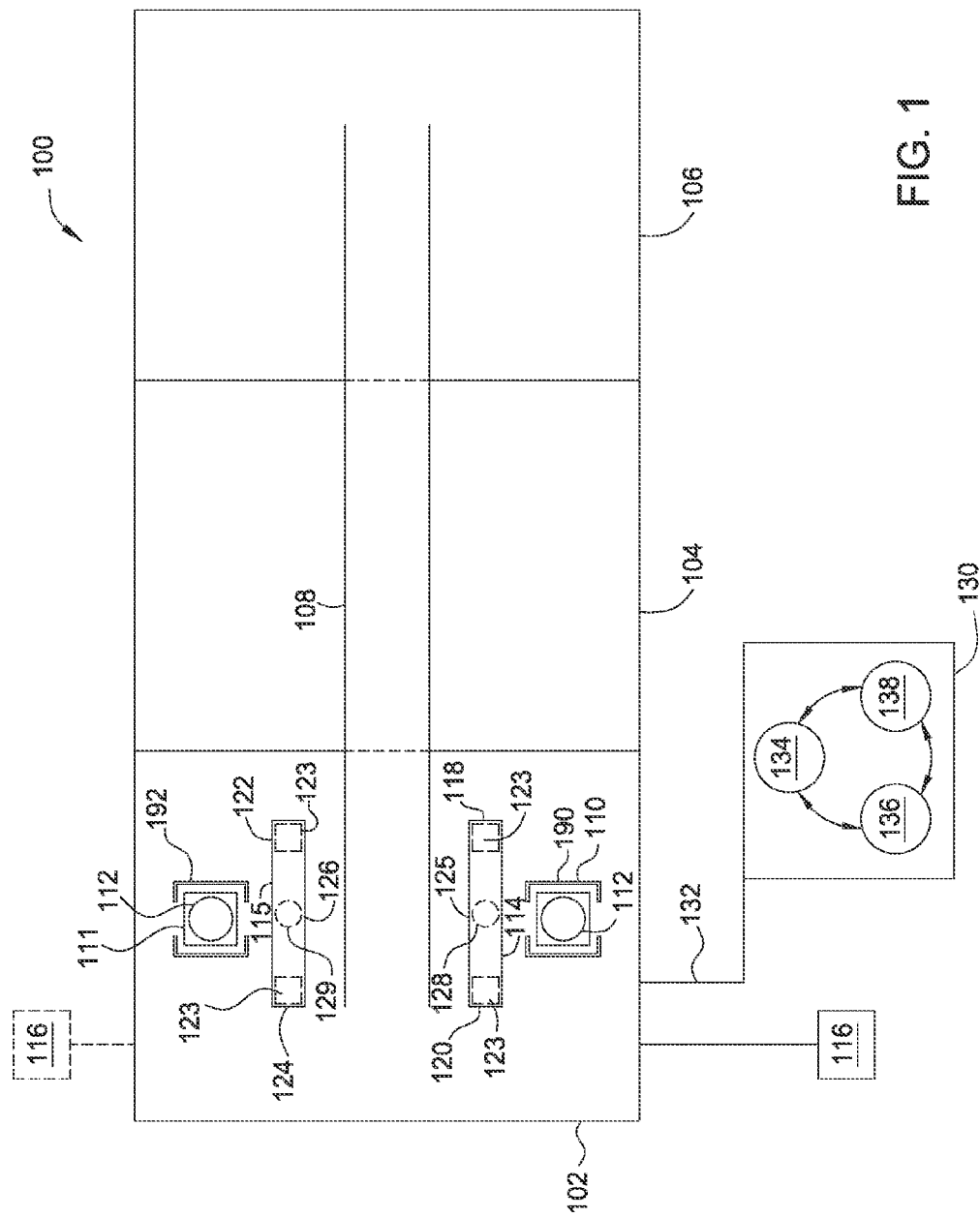
FIG. 1 is a schematic top view of an inspection system having one embodiment of a loading module.

FIG. 1 illustrates a top plan view of a substrate inspection system 100, according to one embodiment. The inspection system 100 includes a loading module 102, a modular unit 104, and a sorting unit 106. In one embodiment, the modular unit 104 may include one or more metrology stations. The metrology stations may include, by way of example only, any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit may be, by way of example only, configured to inspect substrates for cracks, as well as to optionally determine crystal fraction of a substrate. The geometry inspection unit may be configured, by way of example only, to analyze surface properties of a substrate. The saw mark detection unit may be configured, by way of example only, to identify saw marks including groove, step, and double step marks on a substrate. The metrology stations may also include other examples beyond those listed.

The loading module 102, the modular unit 104, and the sorting unit 106 are connected in a linear arrangement such that a substrate may be easily and rapidly passed among the loading module 102, the modular unit 104, and the sorting unit 106 by a conveyor system 108 without exiting the inspection system 100. The loading module 102 is configured to load substrates for transfer through the modular unit 104 and the sorting unit 106 by a conveyor system 108.

The loading module 102 receives one or more cassettes 110, 111 containing substrates 112 in a stacked configuration. Each cassette 110, 111 include a plurality of slots therein. Each slot is configured to hold a substrate 112. The cassettes 110, 111 may be positioned such that the substrates 112 are positioned one over the other. In another example, the substrates 112 may be positioned in a holder such that there is no gap between each substrate 112. The substrates 112 are transferred from the cassettes 110, 111 to the conveyor system 108. The cassette 110 is positioned in a cassette holder 190. The cassette 111 is positioned in a cassette holder 192. In one embodiment, the conveyor system 108 may be a continuous conveyor belt running through the inspection system 100. In another embodiment, the conveyor system 108 may include more than one conveyor belt running through the inspection system 100. The one or more conveyor belts may be disposed sequentially in a linear arrangement to transfer substrates received in the loading module 102 to the modular unit 104.

Figure 2:
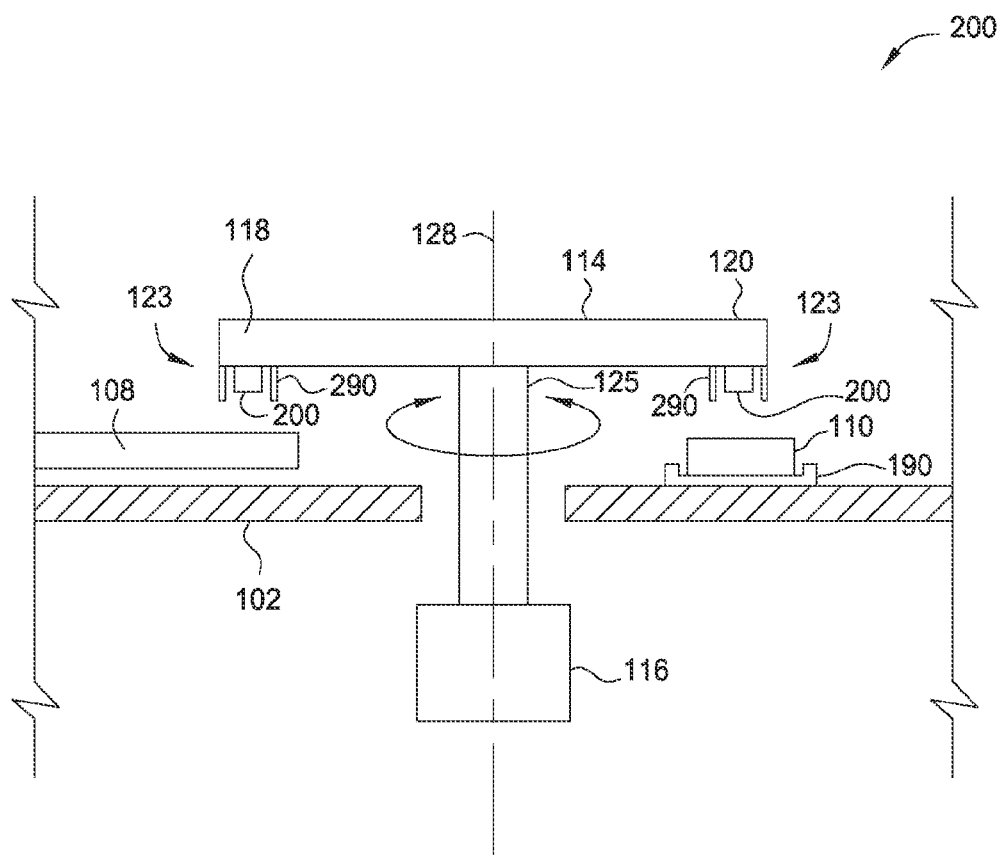
FIG. 2 is a side view of an arm of the loading module plurality of grippers, according to one embodiment.

The loading module 102 includes a plurality of arms (shown for example as arms 114, 115), a plurality of rotatable support members 125, 126, and at least one actuator 116 for rotating the arms 114, 115. The arm 114 includes a first end 118 and a second end 120 opposite the first end 118. The arm 114 is coupled to the rotatable support member 125 at a point located about midway between the ends 118, 120 of the arm 114. The rotatable support member 125 is configured to rotate the arm 114 about an axis 128 passing through the point. The arm 114 may be seen in more detail in FIG. 2.

The arm 115 includes a first end 122 and a second end 124 opposite the first end 122. The arm 115 is coupled to the rotatable support member 126 at a point located about midway between the ends 122, 124 of the arm 115. The rotatable support member 126 is configured to rotate the arm 115 about an aids 129 passing through the point.

The rotatable support members 125, 126 are positioned on opposite sides of the conveyor system 108. The rotatable support member 125 is positioned between the conveyor system 108 and the cassette 110. The rotatable support member 126 is positioned between the conveyor system 108 and the cassette 111. The rotatable support member 125 is positioned to allow the ends 118 of the arm 114 to be selectively positioned over the cassette 110 and the end 120 of the arm 114 to be selectively positioned over the conveyor system 108 to facilitate transfer of substrates therebetween. Likewise, the rotatable support member 126 is positioned to allow the end 122 of the arm 115 to be selectively positioned over the cassette 111 and the end 124 of the arm 115 to be selectively positioned over the conveyor system 108 to facilitate transfer of substrates therebetween.

A substrate gripper 123 is disposed on each end 118, 120, 122, 124 of the arms 114, 115. The gripper 123 may be disposed on a bottom side or end of each of the arms 114, 115 to allow the gripper 123 to secure a substrate 112 for transfer. The gripper 123 may be any suitable substrate gripper, such as a suction gripper, a claw gripper, a magnetic gripper, a Bernoulli vacuum nozzle, and the like. Each cassette 110, 111 may include an elevator (not shown) configured to raise the substrates to a position such that the top most substrate may be grabbed by the substrate gripper 123.

Figure 3:
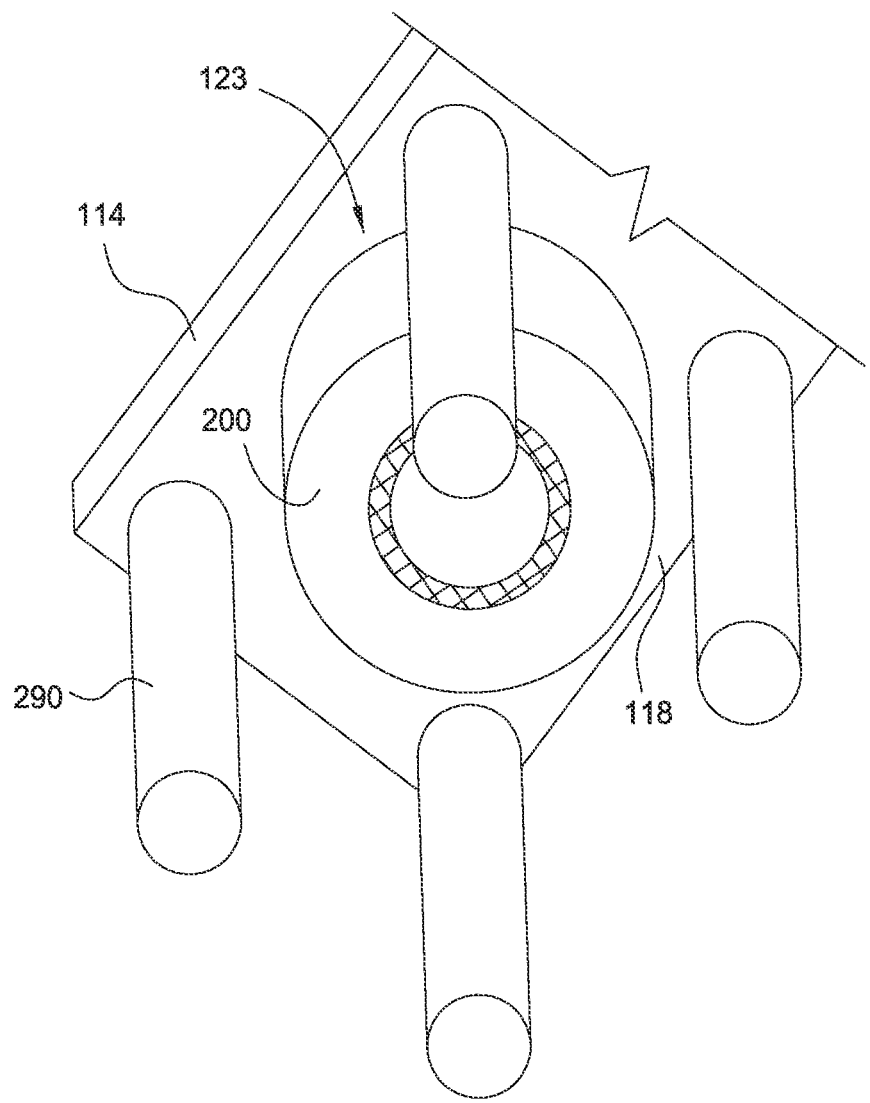
FIG. 3 is a bottom perspective view of the gripper having a Bernoulli vacuum nozzle, according to one embodiment.

FIG. 3 is an isometric bottom view of the gripper 123 having a Bernoulli vacuum nozzle 200. Bernoulli vacuum note 200 The Bernoulli vacuum nozzle 200 enables gripping of the substrate with reduced contact, thus advantageously reducing potential damage to the substrate during handling. The Bernoulli vacuum nozzle 200 may be operated to provide non-contact transfer of the substrate 112 by applying airflow under the substrate 112 in a manner that create a vacuum and lift forces between a center and a circumference of the substrate 112. Due to the vacuum force and the continuous airflow, the substrate 112 does not attach to the Bernoulli vacuum nozzle 200, but rather holds that substrate 112 against one or more stops 290. The stops 290 may be configured as a post or other suitable geometry. The stops 290 may extend from the arm 114 a distance greater than that of the Bernoulli vacuum nozzle 200 to ensure that the substrate 112 does not contact the Bernoulli vacuum nozzle 200 during operation. Ends of stops 290, which contact the substrate 112, may be made of a material selected to provide sufficient friction between the substrate 112 and stop 290 to ensure that the substrate 112 does not shift or slide while the arm 114 is rotated. Thus, the gripper 123 having the Bernoulli vacuum nozzle 200 enables the safe handling of the substrate 112 within the loading module 102.

Referring back to FIG. 1, the rotatable support members 125, 126 may be coupled to the at least one actuator 116. In one embodiment, the support members 125, 126 are coupled to the same actuator 116. In another embodiment, each support member 125, 126 is coupled to separate actuators 116. As discussed above, the actuator 116 is configured to rotate the arms 114, 116 about the support members 125, 126. In one embodiment, the actuator 116 is a stepper motor, a servo motor, a rotary actuator, an air motor or device suitable. The actuator 116 may rotate the rotatable support members 125, 126 in indexing fashion, such that with each motion of the arms 114, 115, a new substrate is received from one of the cassettes 110, 111 by one end of the arms 114, 115 while the opposite end of the arm 114, 115 is transferring a substrate to the same position on the conveyor system 108.

The inspection system 100 may further include a controller 130. The inspection system 100 is coupled to the controller 130 by a communication cable 132. The controller 130 is operable to control processing of a substrate within the inspection system 100. The controller 130 includes a programmable central processing unit (CPU) 134 that is operable with a memory 136 and a mass storage device, an input control unit, and a display unit (not shown), such as power supplies, clocks, cache, input/output (I/O) circuits, and the like, coupled to the various components of the inspection system 100 to facilitate control of the processes of handling and inspecting the substrates. The controller 130 may also include hardware for monitoring the processing of a substrate through sensors (not shown) in the inspection system 100.

To facilitate control of the inspection system 100 and processing a substrate, the CPU 134 may be one of any form of general-purpose computer processors for controlling the substrate process. The memory 136 is coupled to the CPU 134 and the memory 136 is non-transitory and may be one or more of readily available memory such as random access memory (RAM), read only memory (ROM), floppy disk drive, hard disk, or any other form of digital storage, local or remote. Support circuits 138 are coupled to the CPU 134 for supporting the CPU 134 in a conventional manner. The process for loading substrates by operation of the loading module 102 may be stored in the memory 136. The process for loading substrates may also be stored and/or executed by a second CPU (not shown) that is remotely located from the hardware being controlled by the CPU 134.

The memory 136 is in the form of computer-readable storage media that contains instructions, that when executed by the CPU 134, facilitates the operation of the inspection system 100. The instructions in the memory 136 are in the form of a program product such as a program that implements the operation of the inspection system 100, for example, the method 400 of FIG. 4, including for example the operation of the loading module 102. The program code may conform to any one of a number of different programming languages. In one example, the disclosure may be implemented as a program product stored in computer readable storage media for use with a computer system. The program(s) of the program product define functions of the embodiments. Illustrative computer-readable storage media include, but are not limited to: (i) non-writable storage media (e.g., read-only memory devices within a computer such as CD-ROM disks readable by a CD-ROM drive, flash memory, ROM chips or any tope of solid-state non-volatile semiconductor memory) on which information is permanently stored; and (ii) writing storage media (e.g. floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 4:
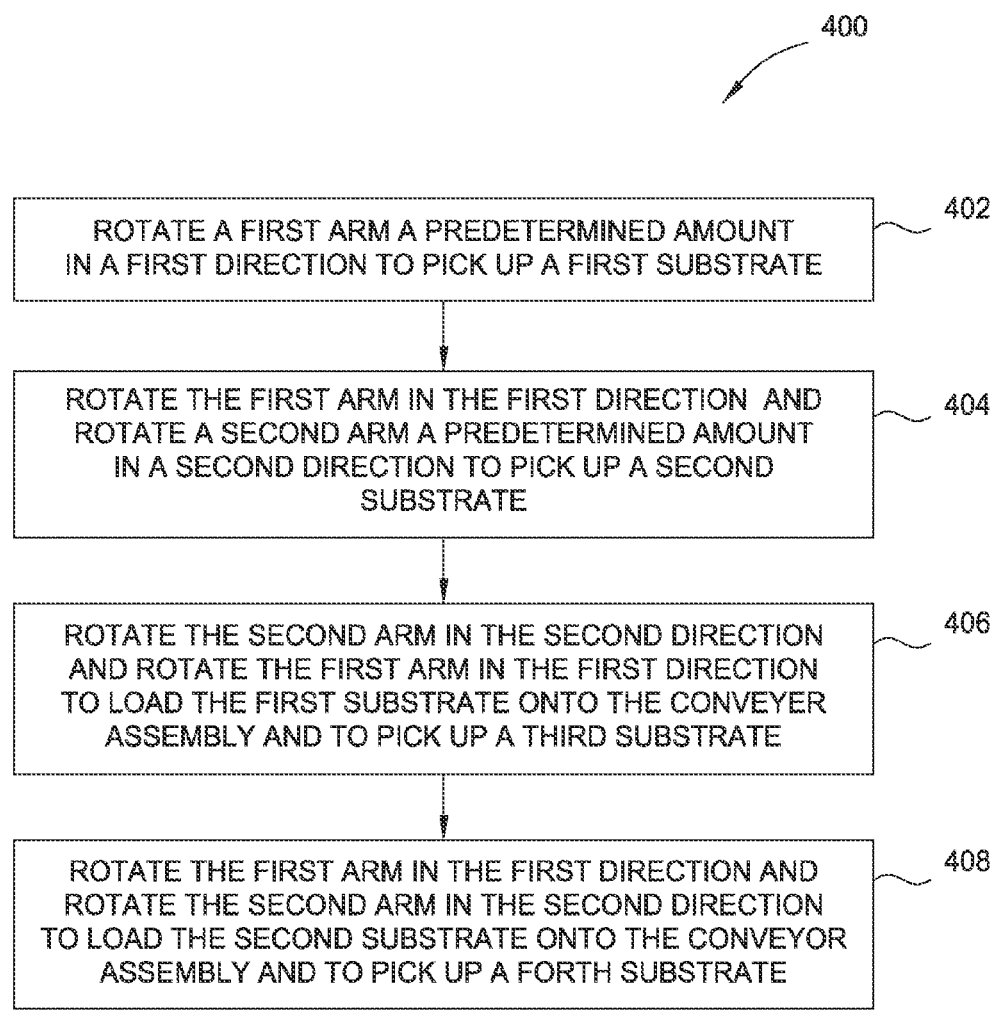
FIG. 4 is a flow diagram of one embodiment of a method for loading substrates in a loading module.
Figure 5A:
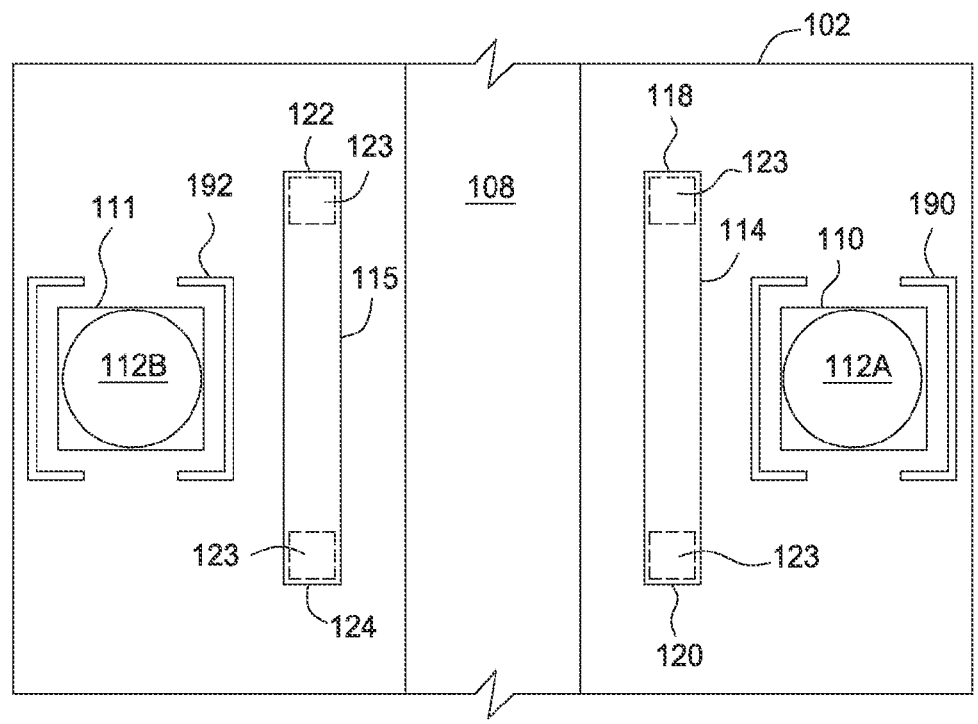
FIGS. 5A-5E illustrate the loading module at different stages of the method of FIG. 4, according to one embodiment.

FIG. 4 illustrates a flow diagram of a method 400 of loading substrates 112 onto the conveyor system 108 in the loading module 102, according to one embodiment. The method 400 rotates the arms 114, 115 in an indexing fashion such that the arms 114, 115 simultaneously pick-up one substrate from a cassette 110, 111 and load another substrate onto the conveyor system 108. The loading module 102 at different stages of method 400 are illustrated in FIGS. 5A-5E. FIG. 5A shows the arms 114, 115 in their initial positions.

Figure 5B:
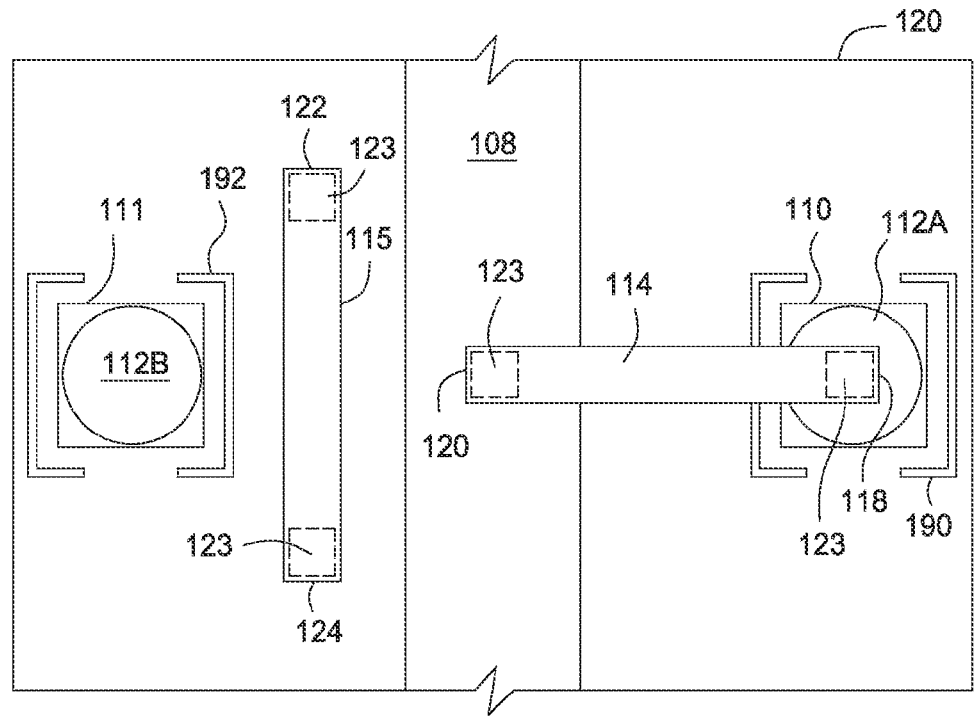

Method 400 begins at block 402. At block 402, an arm of the loading module is rotated a predetermined amount in a first direction, such that an end of the arm is positioned over a first substrate disposed in one of the cassettes. The gripper disposed at the end of the first arm that is positioned over the cassette picks up the first substrate. For example, FIG. 5B illustrates the first arm 114 rotated 90 degrees clockwise such that the first end 118 of the first arm 114 is positioned over the cassette 110. The gripper 123 disposed at the first end 118 of the first arm 114 picks up a first substrate 112a.

Figure 5C:
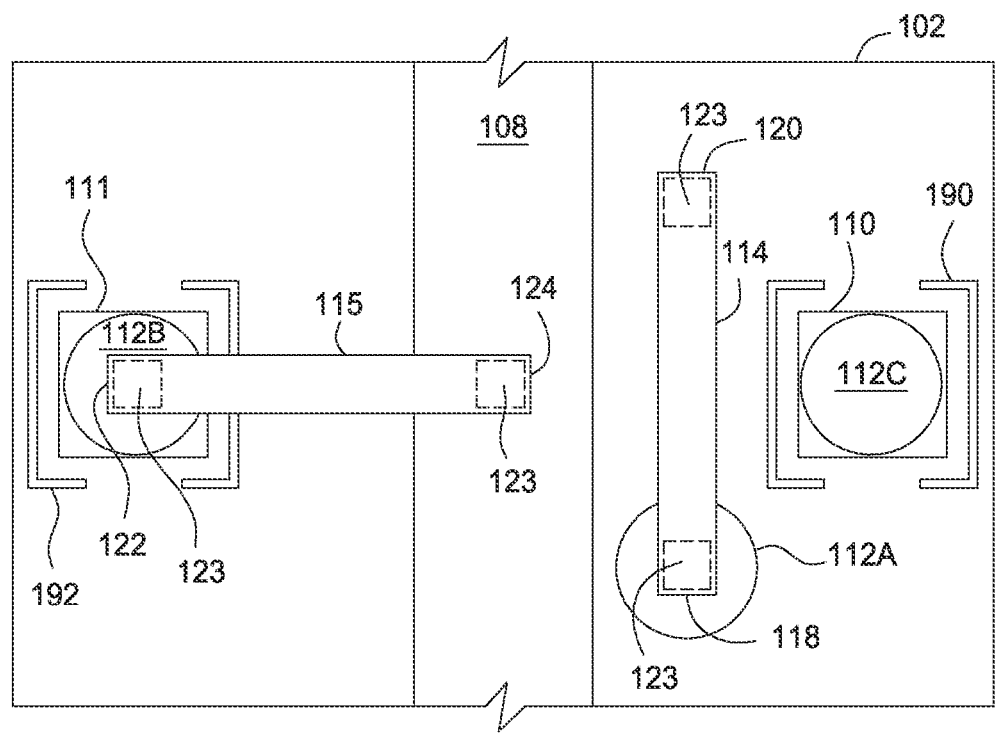

At block 404, the first arm 114 is rotated a predetermined amount in the first direction such that the end of the arm is no longer positioned over the cassette and the conveyor system. The second arm 115 is rotated a predetermined amount in a second direction such that an end of the arm is positioned over a second substrate disposed in the cassette 111. The second direction in which the second arm moves is opposite the first direction in which the first arm moves. By moving the arms 114, 115 in opposite directions, the potential for contact between substrates held on the arms is reduced. The gripper disposed on the end of the second arm that is positioned over the cassette picks up a second substrate. In one embodiment, the arms 114, 115 are connected to the same actuator. When the arms are connected to the same actuator, the likelihood of the arms colliding is minimized because synchronization of the motion of the arms is ensured. In another embodiment, each arm is connected to a separate actuator. The controller controls the actuators such that the rotation of the arms is timed to prevent the arms or substrates held thereon from colliding. For example, FIG. 5C illustrates the first arm 114 rotated 90 degrees clockwise and the second arm 115 rotated 90 degrees counter clockwise. The first arm 114 is in a position substantially perpendicular to the position shown in FIG. 5B to allow the gripper 123 of the second arm 115 to rotate and pick up a second substrate 112b from the cassette 111. The first end 122 of the second arm 115 is positioned over the cassette 111. The second end 124 of the second arm 115 is positioned over the conveyor system 108.

Figure 5D:
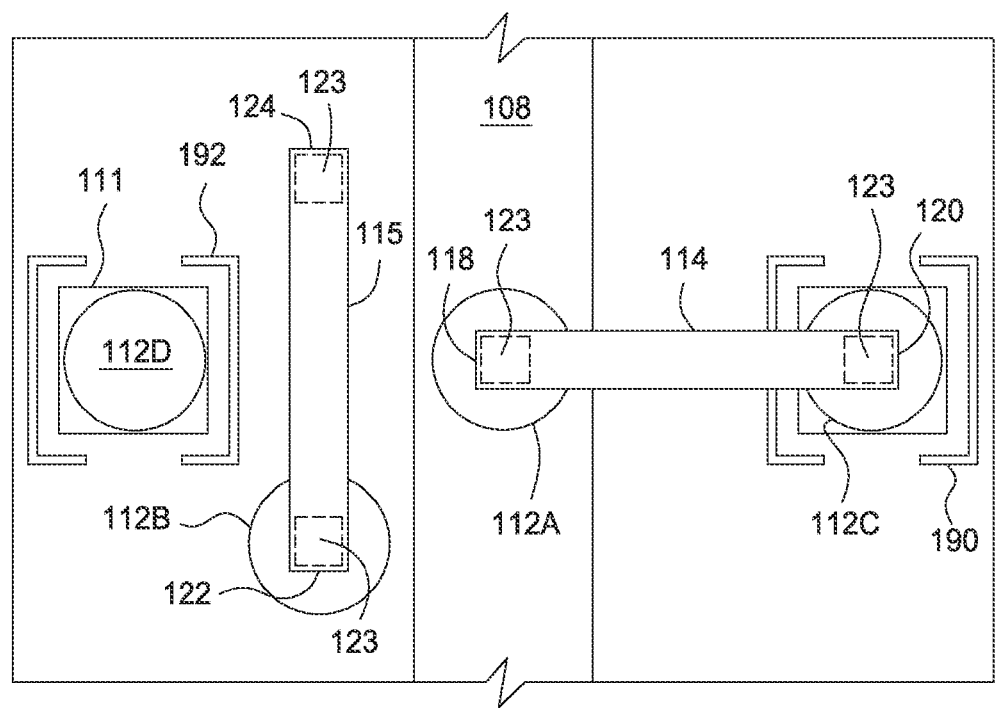

At block 406, the second arm is rotated a predetermined amount in the second direction, such that the ends of the arm are no longer positioned over the cassette and the conveyor system. The first arm is rotated a predetermined amount in the first direction, such that the end not holding the first substrate is positioned over the cassette. The end of the first arm holding the first substrate is positioned over the conveyor system. The gripper disposed on the end of the first arm holding the first substrate releases the substrate onto the conveyor system. The gripper disposed on the end positioned over the cassette picks up a third substrate. For example, FIG. 5D illustrates the first arm 114 rotated 90 degrees clockwise and the second arm 115 rotated 90 degrees counter clockwise. The first arm 114 is in a position substantially perpendicular to the position shown in FIG. 5C such that the first end 118 of the first arm 114 is positioned over the conveyor system 108 and the second end 120 of the first arm 114 is positioned over the cassette 110. The gripper 123 disposed on the first end 118 of the first arm 114 is holding the first substrate 112a picked up in FIG. 5B. The gripper 123 disposed on the first end 118 of the first arm 114 releases the substrate 112a such that the substrate 112a is loaded onto the conveyor system 108. The gripper 123 disposed on the second end 120 of the first arm 114 picks up a third substrate 112c from the cassette 110. The second arm 115 is in a position substantially perpendicular to the position of the second arm 115 shown in FIG. 5C to allow rotation of the first arm 114 without any collisions.

Figure 5E:
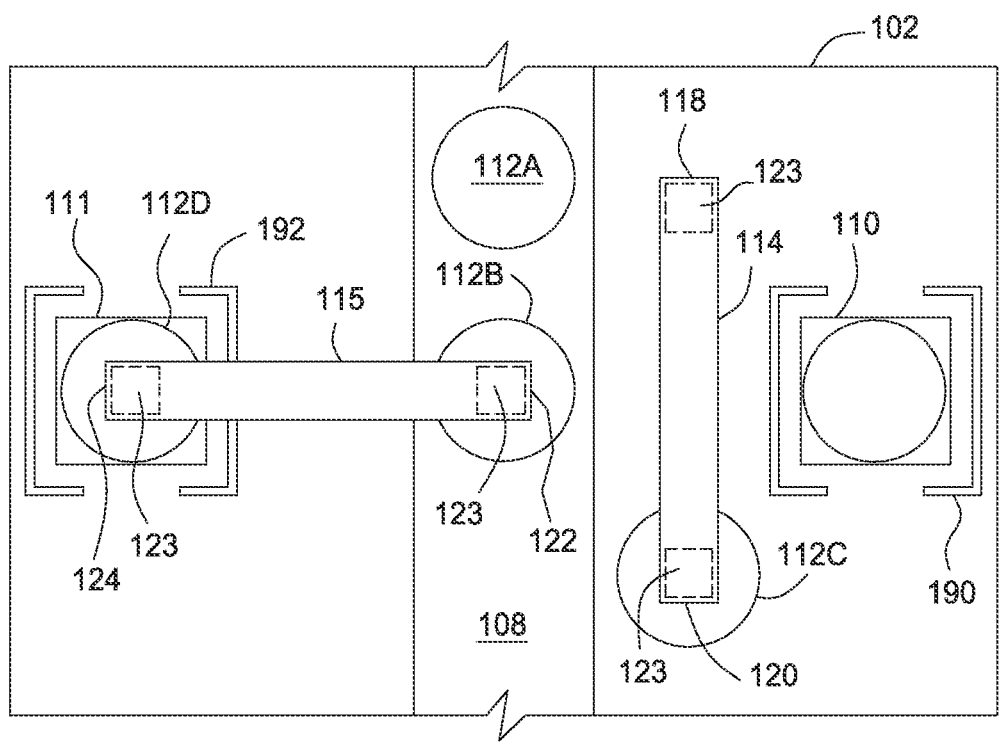

At block 408, the first arm is rotated a predetermined amount in the first direction, such that the ends of the arm are no longer positioned over the cassette and the conveyor system. The second arm is rotated a predetermined amount in the second direction, such that the end not holding the second substrate is positioned over the cassette. The end of the second harm holding the second substrate is positioned over the conveyor system. The gripper 123 disposed on the end of the second arm holding the second substrate releases the substrate onto the conveyor system. The gripper 123 disposed on the end positioned over the cassette picks up a fourth substrate. For example, FIG. 5E illustrates the first arm 114 rotated 90 degrees clockwise and the second arm 115 rotated 90 degrees counterclockwise. The second arm 115 is in a position substantially perpendicular to the position shown in FIG. 5D, such that the first end 122 of the second arm 115 is positioned over the conveyor system 108 and the second end 124 of the second arm 115 is positioned over the cassette 111. The gripper 123 disposed on the first end 122 of the second arm 115 is holding the second substrate 112b picked up in FIG. 4B. The gripper 123 disposed on the first end 122 of the second arm 115 releases the substrate 112b such that the substrate 112b is loaded onto the conveyor system 108. The gripper 123 disposed on the second end 124 of the second arm 115 positioned over the cassette 111 picks up the fourth substrate 112d. The first arm 114 is in a position substantially perpendicular to the position of the first arm 114 shown in FIG. 5D to allow rotation of the second arm 115 without any collisions.

Method 400 may continue in this matter until all substrates from the cassettes 110, 111 are loaded onto the conveyor system 108. Method 400 allows for the advantageous loading in excess of 5000 substrates per hour, which is a significant improvement over conventional inspection systems.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A loading module for a substrate inspection system, the loading module comprising:
   first and second arms, each of the first and second arms having a first end and a second end, wherein the second end is fixed relative to the first end;
   a plurality of substrate grippers, each substrate gripper disposed at each respective end of each of the first and second arms;
   first and second rotatable support members, the first rotatable support member coupled to the first arm between the first end and the second end, and the second rotatable support member coupled to the second arm between the first end and the second end;
   a conveyor system comprising a conveyor belt disposed between the first and second rotatable support members, a first substrate release location defined over the conveyor belt accessible to each of the first arms and the second arm;
   a first cassette holder and a second cassette holder disposed on opposite sides of the conveyor belt, the first cassette holder beyond a range of motion of the second arm; and
   at least one actuator coupled to the first and second rotatable support members, the at least one actuator configured to rotate the first arm about the first rotatable support member to selectively position the first end of the first arm over the first cassette holder and the second end of the first arm over the first substrate release location while the first end of the second arm is selectively positioned away from the first substrate release location, the at least one actuator further configured to sequentially position the first end of the second arm over the first substrate release location while neither the first end of the first arm or the second end of the first arm are positioned over the first cassette holder or the first substrate release location.

2. The loading module of claim 1, wherein each substrate gripper comprises:
   a Bernoulli vacuum nozzle.

3. The loading module of claim 2, wherein each substrate gripper further comprises:
   a plurality of stops extending further from each of the first arm and the second arm than the Bernoulli vacuum nozzle.

4. The loading module of claim 1, wherein the at least one actuator further comprises:
   a single actuator configured to move both the first arm and the second arm simultaneously.

5. The loading module of claim 1, wherein the at least one actuator further comprises:
   a first actuator operable to move the first arm; and
   a second actuator operable to move the second arm.

6. The loading module of claim 1, wherein the at least one actuator further comprises at least one of a stepper motor, a servo motor, a rotary actuator, or an air motor.

7. The loading module of claim 1, wherein the at least one actuator is configured to rotate at least one of the first and second arms in indexing fashion between one of the first and second cassette holders and the substrate release location.

8. The loading module of claim 1 further comprising:
   one or more metrology stations adapted to receive substrates from the conveyor system.

9. A loading module for substrate inspection system, the loading module comprising:
   a conveyor system comprising a first conveyor belt;
   a first cassette holder and a second cassette holder disposed on opposite sides of the conveyor belt;
   a first arm and a second arm disposed on opposite sides of the first conveyor belt, each of the first and second arm comprising:
      a first end;
      a second end fixed relative to the first end;
      a first gripper disposed on a first end; and
      a second gripper disposed on a second end;
   a first rotatable support member coupled to the first arm between the first end and the second end;
   a second rotatable support member coupled to the second arm between the first end and the second end, the conveyor belt being disposed between the first rotatable support member and the second rotatable support member;
   a first actuator coupled to the first rotatable support member, the first actuator configured to rotate the first arm about the first rotatable support member to selectively position the first gripper on the first end of the first arm over the conveyor belt in a first substrate release location while the second gripper on the second end of the first arm is positioned over the first cassette holder; and
   a second actuator coupled to the second rotatable support member, the second actuator configured to rotate the second arm about the second rotatable support member to selectively position the second gripper of the second arm over the the first substrate release location when the first end of the first arm is neither over the first substrate release location or the first cassette holder.

10. The loading module of claim 9, wherein the first gripper comprises:
    a Bernoulli vacuum nozzle.

11. The loading module of claim 10, wherein the first gripper further comprises:
    a plurality of stops extending further from the first arm than the Bernoulli vacuum nozzle.

12. The loading module of claim 9, wherein the first actuator and the second actuator are configured to move the first arm and the second arm simultaneously.

13. The loading module of claim 9, wherein the first actuator and the second actuator are configured to rotate the first arm and the second arm in indexing fashion.

14. The loading module of claim 9 further comprising:
    one or more metrology stations adapted to receive substrates from the conveyor system.

15. The loading module of claim 9, wherein the first actuator is configured to rotate the first arm and the second actuator is configured to rotate the second arm such that each of the first arm and the second arm rotates in an indexing fashion between positions that allow the first arm to transfer substrates between the first cassette holder and the first substrate release position disposed over the conveyor belt and allow the second arm to transfer substrates between the second cassette holder and the first substrate release position disposed over the conveyor belt.

16. A method for loading substrates, the method comprising:

rotating a first end of a first arm a predetermined amount in a first direction to pick up a first substrate from a first cassette holder;

positioning the first substrate on a conveyor belt in a first substrate release position, wherein positioning the first substrate comprises:

rotating the first end of the first arm in the first direction to position the first arm over the first substrate release position, wherein a second end of the first arm is positioned over the first cassette holder and picks up a second substrate from the first cassette holder when the first end of the first arm is positioned over the first substrate release position; and releasing the first substrate on to the conveyor belt when the first arm is positioned in the first substrate release position;

rotating a second arm a predetermined amount in a second direction to pick up a third substrate from a second cassette holder, wherein the second direction is opposite the first direction and wherein the first cassette holder is positioned beyond a range of motion of the second arm;

positioning the third substrate on the conveyor belt in the first substrate release position while the first end of the first arm is positioned neither over the first cassette holder or the first substrate release position, wherein positioning the third substrate comprises:

rotating the second arm in the second direction to position the second arm over the first substrate release position; and releasing the third substrate to position the third substrate on to the conveyor belt when the second arm is positioned in the first substrate release position; and continuing to rotate the first arm in the first direction and the second arm in the second direction to alternately pick up and load other substrates, wherein loading the other substrates comprises positioning the first arm and the second arm over a same position on the conveyor belt.

17. The method of claim 16, wherein the rotating the first arm in the first direction comprises:

moving the arm in an indexing fashion.

18. The method of claim 16 further comprising:

performing metrology on the first substrate and the other substrates disposed on the conveyor system.

19. The method of claim 16 further comprising:

securing the first substrate to the first arm utilizing a Bernoulli vacuum nozzle.

20. The method of claim 16, further comprising:

positioning the second substrate on the conveyor belt in the first substrate release position, wherein positioning the second substrate comprises:

rotating the second end of the first arm in the first direction to position the second end of the first arm over the first substrate release position, wherein the first end of the first arm is positioned over the first cassette holder when the second end of the first arm is positioned over the first substrate release position; and releasing the second substrate on to the conveyor belt when the second end of the first arm is positioned in the first substrate release position.

* * * * *